(12) United States Patent  
Kim et al.

(10) Patent No.: US 8,432,736 B2
(45) Date of Patent: Apr. 30, 2013

(54) NONVOLATILE MEMORY DEVICE AND METHOD OF PROGRAMMING THE SAME

(75) Inventors: In-Soon Kim, Seoul (KR); Huikwon Seo, Hwaseong-si (KR); Seijin Kim, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 202 days.

(21) Appl. No.: 13/048,120

(22) Filed: Mar. 15, 2011

(65) Prior Publication Data

US 2011/0228588 A1 Sep. 22, 2011

(30) Foreign Application Priority Data

Mar. 16, 2010 (KR) .................. 10-2010-0023362

(51) Int. Cl.
*G11C 11/34* (2006.01)

(52) U.S. Cl.
USPC ............ 365/185.03; 365/185.08; 365/185.17; 365/185.18; 365/185.23; 365/185.29; 365/185.33

(58) Field of Classification Search ............ 365/185.03, 365/185.08, 185.17, 185.18, 185.23, 185.29, 365/185.33
See application file for complete search history.

(56) References Cited

U.S. PATENT DOCUMENTS

| 6,917,543 | B2 | | 7/2005 | Sato | |
|---|---|---|---|---|---|
| 7,161,839 | B2 | | 1/2007 | Im | |
| 7,298,648 | B2 | * | 11/2007 | Lee et al. | 365/185.03 |
| 7,466,597 | B2 | * | 12/2008 | Kim | 365/185.17 |
| 7,486,557 | B2 | * | 2/2009 | Kim et al. | 365/185.18 |
| 7,489,565 | B2 | * | 2/2009 | Cho et al. | 365/185.23 |
| 7,545,680 | B2 | * | 6/2009 | Kim et al. | 365/185.23 |
| 7,580,322 | B2 | * | 8/2009 | Im | 365/185.23 |
| 7,684,246 | B2 | * | 3/2010 | Jeong et al. | 365/185.18 |
| 7,826,276 | B2 | * | 11/2010 | Park et al. | 365/185.17 |
| 8,054,682 | B2 | * | 11/2011 | Kang et al. | 365/185.03 |

FOREIGN PATENT DOCUMENTS

| JP | 2004095029 A | 3/2004 |
|---|---|---|
| JP | 2006107719 A | 4/2006 |
| JP | 2006114042 A | 4/2006 |
| KR | 20040020001 A | 3/2004 |
| KR | 20060028983 A | 4/2006 |
| KR | 20060032507 A | 4/2006 |

* cited by examiner

*Primary Examiner* — Trong Phan
(74) *Attorney, Agent, or Firm* — Volentine & Whitt, PLLC

(57) ABSTRACT

A nonvolatile memory device includes a memory cell array having multiple memory cells, a data input/output buffer for temporarily storing data to be stored in the memory cells, and a data scanner for scanning the data stored temporarily in the data input/output buffer. The nonvolatile memory device further includes control logic for reading address information of a memory cell in which at least a portion of the data is to be stored and selectively performing a data scan operation according to the read address information.

20 Claims, 11 Drawing Sheets

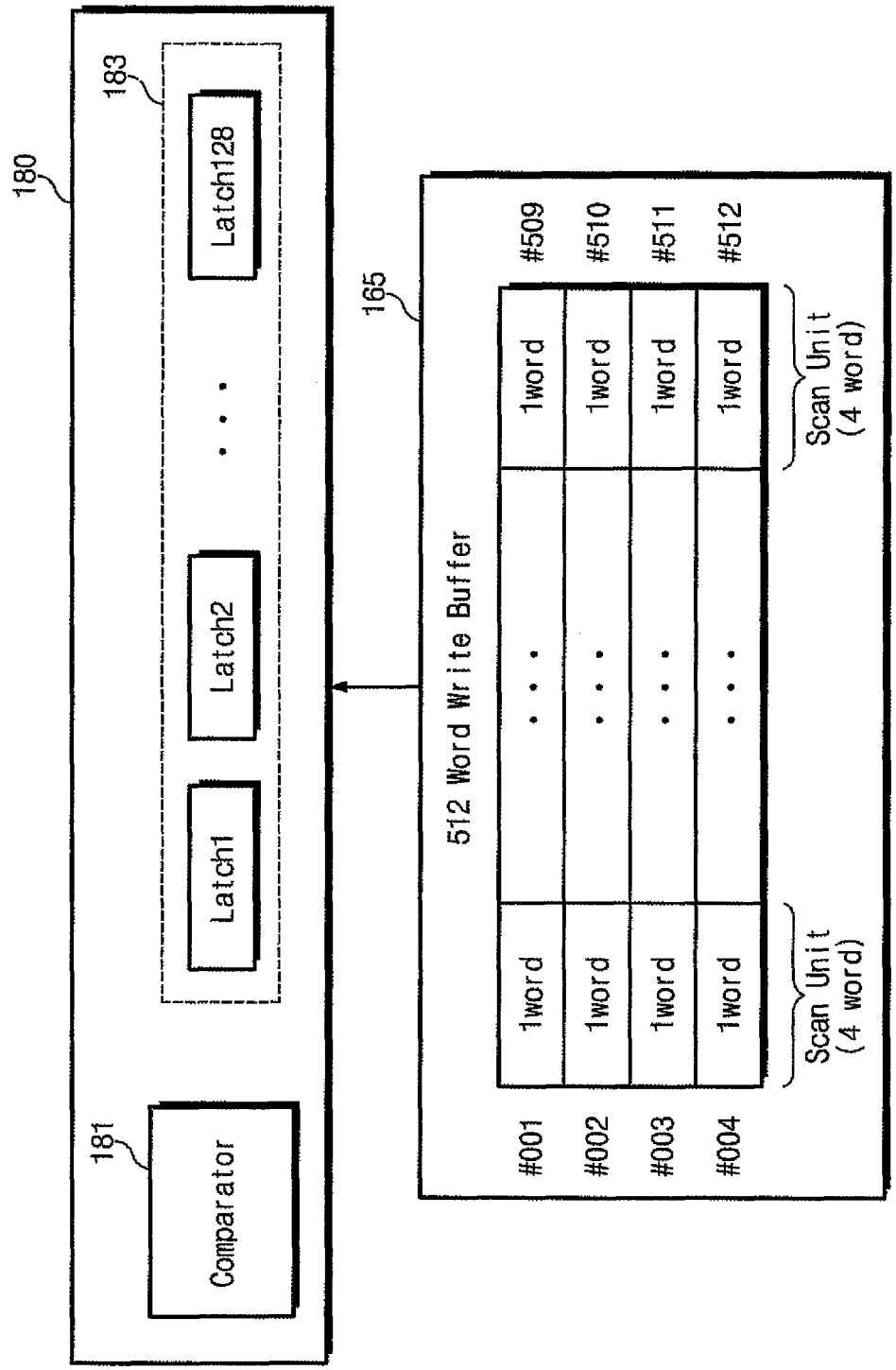

NONVOLATILE MEMORY DEVICE AND METHOD OF PROGRAMMING THE SAME

CROSS-REFERENCE TO RELATED APPLICATIONS

A claim of priority under 35 U.S.C. §119 is made to Korean Patent Application No. 10-2010-0023362, filed on Mar. 16, 2010, the entire contents of which are hereby incorporated by reference.

BACKGROUND

The disclosure herein relates to semiconductor memory devices, and more particularly, to nonvolatile memory devices and to methods of programming nonvolatile memory devices.

Semiconductor memory devices are typically classified as either volatile or nonvolatile depending on their ability to retain stored data in the absence of supplied power. In particular, a volatile memory device loses stored data when supplied power is cut off, whereas a nonvolatile memory device retains stored data when supplied power is cut off. Examples of nonvolatile memory types include flash memory, ferroelectric random access memory (RAM) (FRAM), magnetic RAM (MRAM), and phase change RAM (PRAM).

The type of nonvolatile memory generally depends on the configuration of memory cell transistors thereof. For example, the PRAM is a nonvolatile memory device that uses phase change caused by a temperature change, i.e., a resistance change. The PRAM includes a memory element and a select element. With respect the PRAM, manufacturing processes are relatively simple and memory devices of a large capacity are realized at a low cost.

Flash memory devices typically are divided into NOR flash memory devices and NAND flash memory devices, according to the structure of the cell array. NOR flash memory devices store data through a channel hot electron method and erase the stored data through a Folwer-Nordheim (F-N) tunneling method. NAND flash memory devices stores or erases data through the F-N tunneling method.

A NOR flash memory device has a structure in which each memory cell transistor is separately connected to a bit line and a word line. Therefore, the NOR flash memory device has good random access time properties. A NAND flash memory device has a structure in which multiple memory cell transistors are connected in serial. This structure is referred to as a string structure, requiring one bit line contact for each cell string. Therefore, the NAND flash memory device has good properties in terms of integration.

SUMMARY

The present disclosure provides a nonvolatile memory device and a method of programming the same.

Embodiments of the inventive concept provide a nonvolatile memory device that includes a memory cell array having multiple memory cells, a data input/output buffer for temporarily storing data to be stored in the memory cells, and a data scanner for scanning the data stored temporarily in the data input/output buffer. The nonvolatile memory device further includes control logic for reading address information of a memory cell in which at least a portion of the data is to be stored and selectively performing a data scan operation according to the read address information.

The data scanner may include a storage unit for storing information on whether to perform a data scan operation. The storage unit may correspond to a scan unit of the data scanner.

The control logic may include an address detector for reading the address information. The address detector determines whether address information corresponding to an offset address of the scan unit is received, and the control logic stores data in the corresponding storage unit according to a determination result of the address detector. The data scan operation may be selectively performed according to the data stored in the storage unit.

The storage unit may be set by grouping the data stored temporarily in the data input/output buffer and the data scan operation may be performed by the scan unit. Also, the storage unit may be a register.

The data scanner may distinguish a program state according to a data value stored temporarily in the data input/output buffer and aligns data to be programmed simultaneously based on the distinguished program state. The data scanner may search actual data bits to be programmed among the data stored temporarily in the data input/output buffer.

Further, the data scanner may include a latch circuit for storing a scanned result. The nonvolatile memory device may further include a write driver for programming the data stored in the latch circuit simultaneously by the number of bits that are simultaneously programmable in a corresponding memory cell.

The data input/output buffer may input or output data by an N byte unit (N is a natural number).

The memory cell array may include multiple bit lines, each of the bit lines connecting multiple memory cells arranged in parallel. A memory element of each memory cell may include a variable resistance material.

Other embodiments of the inventive concept provide a nonvolatile memory device that includes a memory cell array including multiple memory cells, a data input/output buffer for temporarily storing data to be stored in the memory cells, a data scanner for aligning the data stored temporarily in the data input/output buffer by data to be programmed simultaneously according to a data value, and control logic for controlling a scan operation of the data scanner. The data scanner includes a storage unit for storing information on whether to perform a data scan operation of a corresponding scan unit. The control logic stores information on whether to perform a data scan operation in the storage unit according to address information of a memory cell in which the data is to be stored, and selectively performs the scan operation according to a stored value of the storage unit.

The data scanner may search actual data bits to be programmed among the data stored temporarily in the data input/output buffer.

Still other embodiments of the inventive concept provide a method of programming a nonvolatile memory device. The method includes receiving data and an address from an external device, temporarily storing the received data in a data input/output buffer, reading the address, storing information on whether to scan the temporarily stored data according to the input address, and selectively performing a data scan operation according to the stored information on whether to scan the temporarily-stored data.

Reading the address may include reading by scan unit which is set by grouping the temporarily stored data. Further, storing the information on whether to scan the temporarily stored data may include storing a logic high value in a storage unit corresponding to the scan unit when an address corresponding to an offset address of the scan unit is read. When at least one address corresponding to an offset address of the scan unit is read, the storage unit may stores a logic high value.

Storing the information on whether to scan the temporarily stored data and selectively performing the data scan operation may be completed before a program operation is performed.

BRIEF DESCRIPTION OF THE DRAWINGS

The embodiments of the inventive concept will be described with reference to the attached drawings, in which:

FIG. 5 is a block diagram illustrating operation of a data scanner, according to a first embodiment of the inventive concept;

DETAILED DESCRIPTION OF THE EMBODIMENTS

Figure 1:
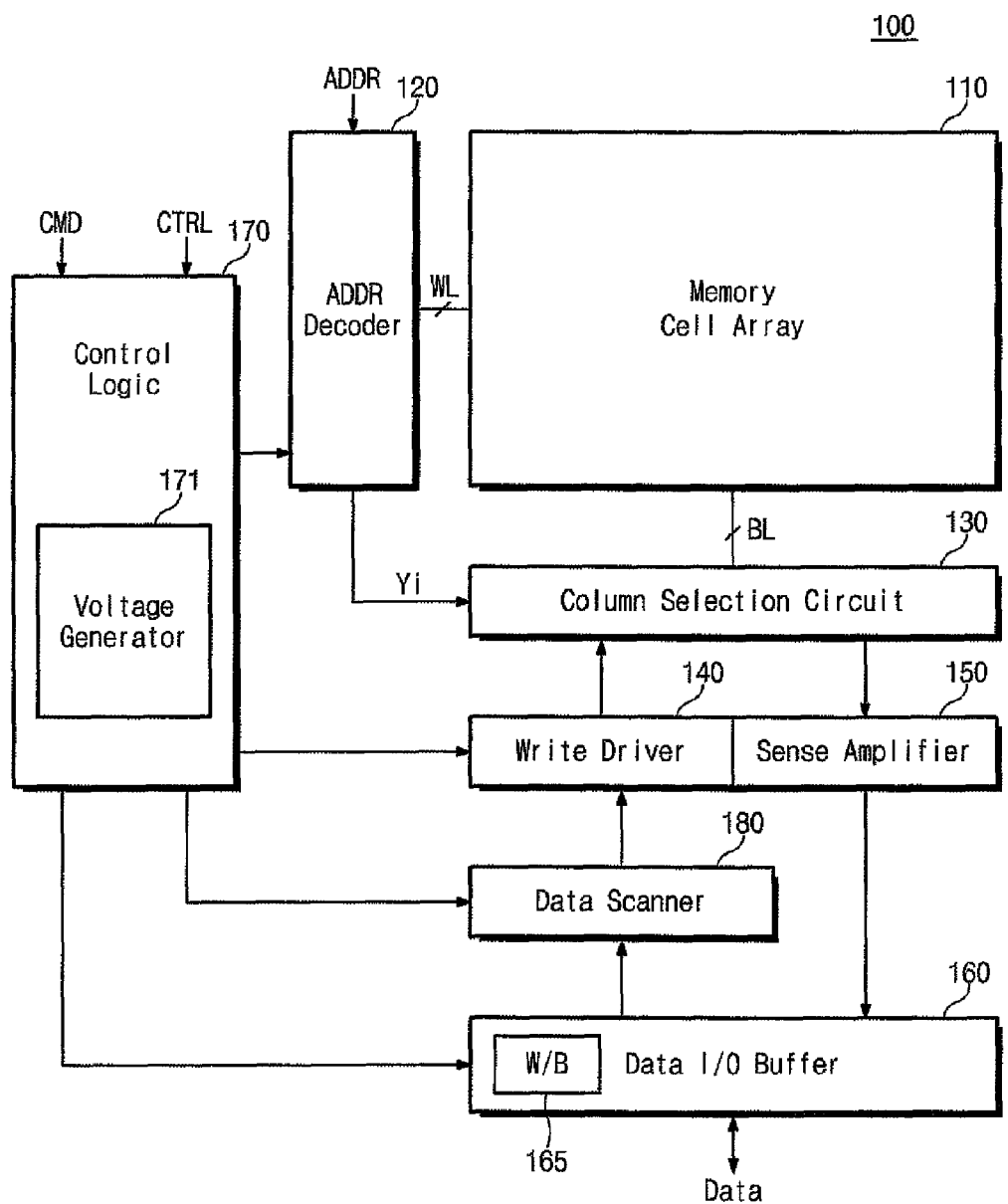
FIG. 1 is a block diagram illustrating a nonvolatile memory device, according to an embodiment of the inventive concept.

The inventive concept will now be described more fully with reference to the accompanying drawings, in which exemplary embodiments of the inventive concept are shown. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept.

In the drawings, the thicknesses of layers and regions are exaggerated for clarity. Unless otherwise noted, like reference numerals denote like elements throughout the attached drawings and written description, and thus descriptions will not be repeated.

When one part (or element, device, etc.) is referred to as being "connected" to another part (or element, device, etc.), it should be understood that the former can be "directly connected" to the latter, or "electrically connected" to the latter via an intervening part (or element, device, etc.). Also, the meaning of "include," "comprise," "including," or "comprising," specifies a property, a region, a fixed number, a step, a process, an element and/or a component, but does not necessarily exclude other properties, regions, fixed numbers, steps, processes, elements and/or components.

Hereinafter, exemplary embodiments of the inventive concept will be described in detail with reference to the accompanying drawings.

FIG. 1 is a block diagram illustrating a nonvolatile memory device, according to an embodiment of the inventive concept. The nonvolatile memory device consists of a NOR flash memory device, for example, although the nonvolatile memory device is not limited to a NOR flash memory device. For example, the nonvolatile memory device may be a NAND flash memory device, a phase-change RAM (PRAM), a ferroelectric RAM (FRAM), a magnetic RAM (MRAM), or the like.

Referring to FIG. 1, a representative flash memory device 100 includes a memory cell array 110, an address decoder 120, a column selection circuit 130, a write driver 140, a sense amplifier 150, a data input/output buffer 160, control logic 170 and a data scanner 180.

The memory cell array 110 includes memory cells for storing data. Multiple memory cells constitute a block, and multiple blocks constitute a bank. The flash memory device 100 performs a write operation by word unit or byte unit, and performs an erase operation by block unit.

Each memory cell of the memory cell array 110 may store single bit data or multi-bit data. Generally, a memory cell storing single bit data is a single level cell (SLC) and a memory cell storing multi-bit data of more than two bits is a multi level cell (MLC). An SLC has an erase state and one program state according to a threshold voltage. An MLC has an erase state and multiple program states according to a threshold voltage. For example, an MLC storing two-bit data may have an erase state (state "11") and multiple program states (states "10", "01" and "00").

The address decoder 120 is connected to the memory cell array 110 through word lines WL. The address decoder 120 decodes an external address ADDR and selects at least one word line WL from among the word lines WL. The address decoder 120 also supplies a bias voltage to the selected word line WL. Additionally, the address decoder 120 generates a select signal Yi for selecting a bit line BL. The select signal Yi is provided to the column selection circuit 130.

The column selection circuit 130 is connected to the memory cell array 110 through bit lines BL. The column selection circuit 130 selects a bit line BL in response to the select signal Yi provided by the address decoder 120. The column selection circuit 130 selects bit lines BL by predetermined units (e.g., x8, x16 and so forth) in response to the select signal Yi. The column selection circuit 130 connects a bit line BL with a data line DL during a write operation and connects a bit line BL with a sense line SL during a read operation, in response to the select signal Yi.

The write driver 140 applies a program voltage to a selected bit line BL under control of the control logic 170 during a program operation. That is, the write driver 140 programs a selected memory cell in the memory cell array 110. Additionally, the write driver 140 erases a block selected under control of the control logic 170.

The sense amplifier 150 senses the difference between a voltage of a sense line SL and a reference voltage during a read operation, in order to read data stored in a selected memory cell. The reference voltage is provided by a reference voltage generation circuit (not shown). The sense amplifier 150 reads data stored in a selected memory cell under control of the control logic 170.

The data input/output buffer 160 receives data from an input/output terminal and provides the received data to the write driver 140 to be written to the memory cell array 110, or outputs data read from the sense amplifier 150 to an external device via the input/output terminal, under control of the control logic 170. The data input/output buffer 160 temporarily stores data to be programmed in the write buffer 165 during a program operation. In the depicted embodiment, the data input/output buffer 160 includes write buffer 165. Data stored in the write buffer 165 are programmed into a corresponding memory cell through the write driver 140. Data to be programmed may be sequentially or selectively stored in the write buffer 165. The data input/output buffer 160 may input or output data by an N byte unit, for example, where N is a natural number.

The control logic 170 controls operations of the flash memory device 100 in response to a control signal CTRL and a command CMD from an external device, such as a host, a memory controller, a memory interface, or the like. For example, the control logic 170 controls read, write (or program) and erase operations of the flash memory device 100. For these operations, the control logic 170 generates control signals and controls a voltage generator 171 to generate bias voltages, respectively.

The data scanner 180 scans data stored temporarily in the input/output buffer 160 under control of the control logic 170, searching actual data bits to be programmed. The data scanner 180 scans data to be programmed by scan unit, and sorts the scanned data by data pattern. The data pattern may be in a state of a memory cell, which is distinguished according to a threshold voltage distribution of memory cells. For example, an SLC may have an erase state (data "1") and one program state (data "0"), and an MLC may have an erase state (data "11") and multiple program states (data "10", "01" and "00").

Aligned data are simultaneously programmed for each data pattern by a predetermined number. According to an embodiment of the inventive concept, a scan operation of the data scanner 180 is performed according to values of scan registers allocated by scan units. For example, when the value of a scan register is set, a scan operation is performed on data of the corresponding scan unit. When the value of the scan register is reset, a scan operation is not performed on data of the corresponding scan unit. The value of each scan register is determined according to an address provided with the data. The scan unit may be set, for example, by grouping the data stored temporarily in the data input/output buffer 160, and the data scan operation may be performed by scan unit. Operations of the data scanner 180 are described in more detail with reference to FIGS. 5-7.

Figure 2:
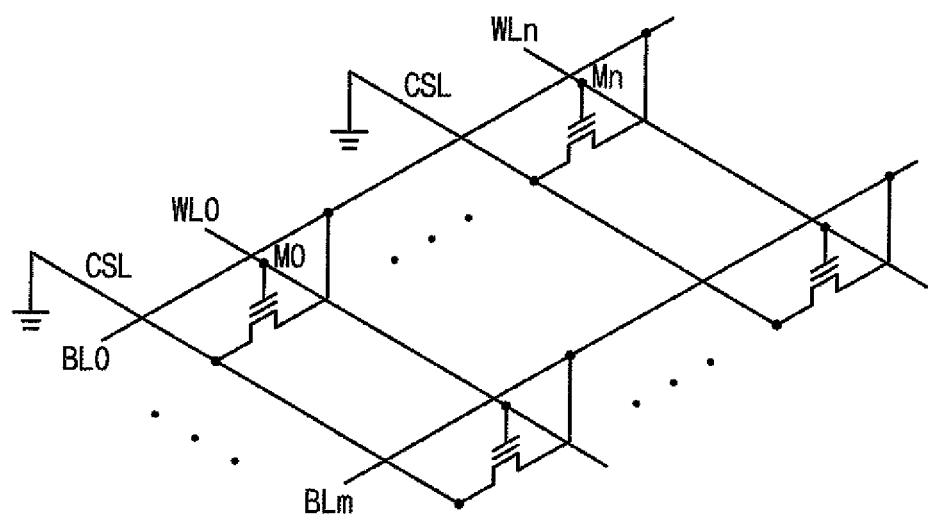
FIG. 2 is a circuit diagram illustrating a structure of a memory cell array in a flash memory device.

FIG. 2 is a circuit diagram illustrating a structure of a memory cell array in a flash memory device.

Referring to FIG. 2, a structure of memory cell array 110 in a NOR flash memory device is shown. The memory cell array 110 of a NOR flash memory device consists of multiple blocks. FIG. 2 illustrates one representative block as an example.

The representative block includes multiple memory cells M0 to Mn connected to each bit line BL0 to BLm. The memory cells M0 to Mn connected to each bit line are arranged in parallel to one another. For example, each of the memory cells M0 to Mn is connected to bit line BL0 and a common source line CSL. Additionally, word lines WL0 to WLn are connected to gates of the memory cells M0 to Mn, respectively. Accordingly, the memory cells M0 to Mn are selected according to selection of a corresponding word line (selection word line) and bit line (selection bit line).

Figure 3:
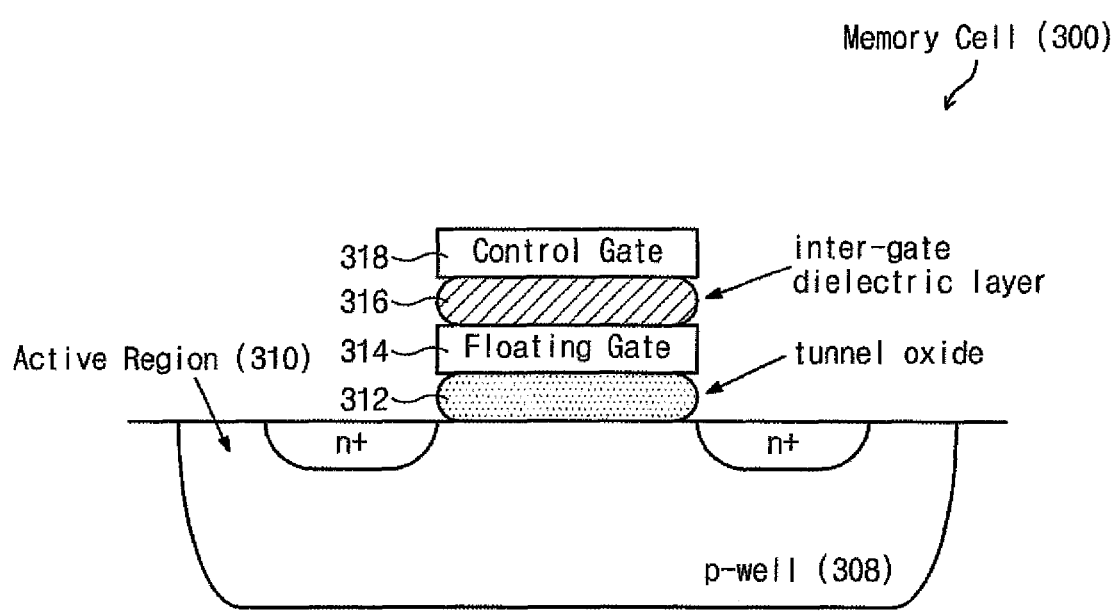
FIG. 3 is a sectional view illustrating a structure of a memory cell, according to an embodiment of the inventive concept.

Referring to FIG. 3, a representative memory cell 300 includes a charge storage layer as a floating gate 314. For example, a tunnel oxide 312, a floating gate 314 for storing data, an inter-gate dielectric layer 316, and a control gate 318 for controlling the floating gate 314 are sequentially stacked between n+regions on an active region 310. The floating gate 314 is insulated by an insulation layer (not shown). Accordingly, charges may be stored in the floating gate 314 according to an electric field from the control gate 318. Additionally, charges stored in the floating gate 314 may be removed according to an electric field from a well, such as p-well 308.

Figure 4A:
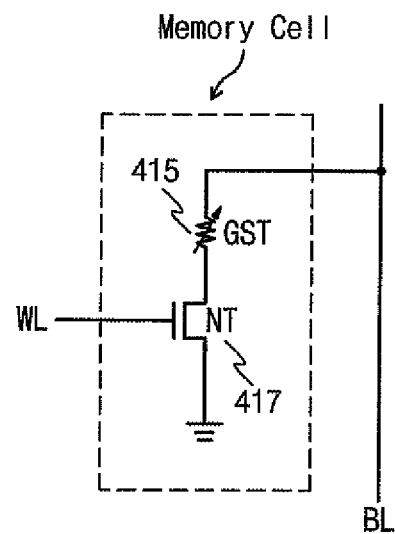
FIGS. 4A and 4B are circuit diagrams illustrating structures of memory cells, according to embodiments of the inventive concept.
Figure 4B:
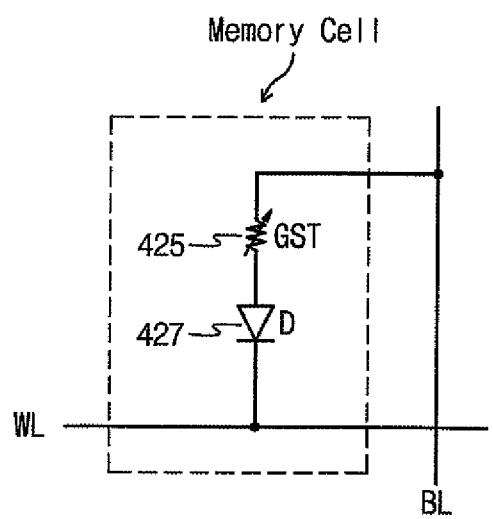

FIGS. 4A and 4B are circuit diagrams illustrating structures of a memory cell, according to embodiments of the inventive concept.

FIGS. 4A and 4B show memory cells of a variable resistance memory device. The memory cells include memory elements 415 and 425 and select elements 417 and 427, respectively. Each of the memory elements 415 and 425 includes a variable resistance material GST. The select element 417 includes transistor NT, and the select element 427 includes diode D.

The resistance value of the variable resistance material (e.g., Ge—Sb—Te(GST)) varies according to temperature. The variable resistance material GST has one of two stable states (i.e., a crystal state and an amorphous state) according to temperature. The variable resistance material GST changes into a crystal state or an amorphous state in response to current supplied through a bit line BL, which varies the temperature. The crystal state stores data "0" and is called a "set state." The amorphous state stores data "1" and is called a "reset state." Moreover, the memory cell may have intermediate states between the crystal state and the amorphous state. Accordingly, the memory cell may consist of an MLC that stores data of more than two bits.

Referring to FIG. 4A, the select element 417 includes NMOS transistor NT. Word line WL is connected to a gate of the NMOS transistor NT. The NMOS transistor NT is turned on when a predetermined voltage is applied to the word line WL. Once the NMOS transistor NT is turned on, the memory element 415 receives current through the bit line BL. In FIG. 4A, the memory element 415 is connected between a bit line BL and the select element 417. However, the select element 417 may be connected between a bit line BL and a memory device.

Referring to FIG. 4B, the select element 427 includes diode D. The memory element 425 is connected to an anode of the diode D, and word line WL is connected to a cathode of the diode D. When a voltage difference between the anode and cathode of the diode D is higher than a threshold voltage of the diode D, the diode D is turned on. The memory element 425 receives current through the bit line BL when the diode D is turned on.

FIG. 5 is a block diagram illustrating an operation of a data scanner, according to a first embodiment of the inventive concept.

Referring to FIG. 5, write buffer 165 of the data input/output buffer 160 and the data scanner 180 of FIG. 1 are shown in more detail. Because of structural characteristics, the flash memory device 100 of FIG. 1 is not able to perform a data overwrite operation. Accordingly, the flash memory device 100 performs an erase operation first in order to program new data on memory cells having data. When the data to be programmed is data "1" (in case of an SLC) or data "11" (in case of an MLC), the flash memory device 100 does not perform a program operation, but has the same state as if data "1" or data "11" were programmed on the memory cell.

As discussed above, the flash memory device 100 scans data to be programmed in order to improve program speed. The data scanner 180 scans data on which an actual program operation is to be performed under control of the control logic 170 of FIG. 1. For example, in case of an SLC or an MLC, data "0" is scanned. As another example, in case of a state-based memory device programmed based on program state, a program state (e.g., program states "10", "01" and "00") is scanned. The write driver 140 of FIG. 1 selectively programs data by the number of simultaneous program bits, which are to be programmed according to the scan result. For example, the flash memory device 100 may apply a high voltage of about 4 V to about 6 V to a drain of a memory cell during a program operation. Thus, a large amount of program current is consumed.

As discussed above, the data input/output buffer 160 of FIG. 1 includes the write buffer 165, which temporarily stores data to be programmed, received from an external device, under control of the control logic 170. Additionally, the write buffer 165 supplies the temporarily stored data to the scanner 180 under control of the control logic 170.

The write buffer 165 stores more data than the amount of data loaded into the write driver 140 during a program operation in order to buffer the program operation. According to the depicted embodiment, the write buffer 165 includes multiple scan units, each of which includes four words of data, for example, and is sequentially configured in an entire write buffer. Accordingly, the write buffer 165 may be a 512 Word Write Buffer configured to store data of 512 words of data (depicted in FIG. 5 as "1 word" #001, #002, #003, #004, . . . , #509, #510, #511, and #512). Moreover, the write buffer 165 may store data to be programmed by one word until the buffer is full.

The data scanner 180 receives the data of the scan units (e.g., four words) from the write buffer 165. The data scanner 180 scans the data on which an actual program operation is to be performed. In order to perform the data search, the data scanner 180 includes a comparator 181 and multiple latches 183 (i.e., Latch1, Latch2, ... , Latch128). The latches 183 are configured to correspond to the scan units, respectively. The comparator 181 compares bits provided from the write buffer 165 under control of the control logic 170. The scan latches 183 store scanned results under control of the control logic 170.

For example, when a memory cell is an SLC storing single bit data, the data scanner 180 scans a data bit of the provided data that is actually to be programmed. That is, the data scanner 180 scans data having a value of "0". As another example, when a memory cell is an MLC storing multi-bit data of more than two bits, the data scanner 180 scans data bits that are actually programmed on the provided data. That is, the data scanner 180 scans data having a value of "0". As another example, in case of a state based memory device, the data scanner 180 scans the program state (i.e., program states "10", "01" and "00"). The data scanner 180 is aligned to program simultaneously the same program states among the scanned programmed states.

Figure 6:
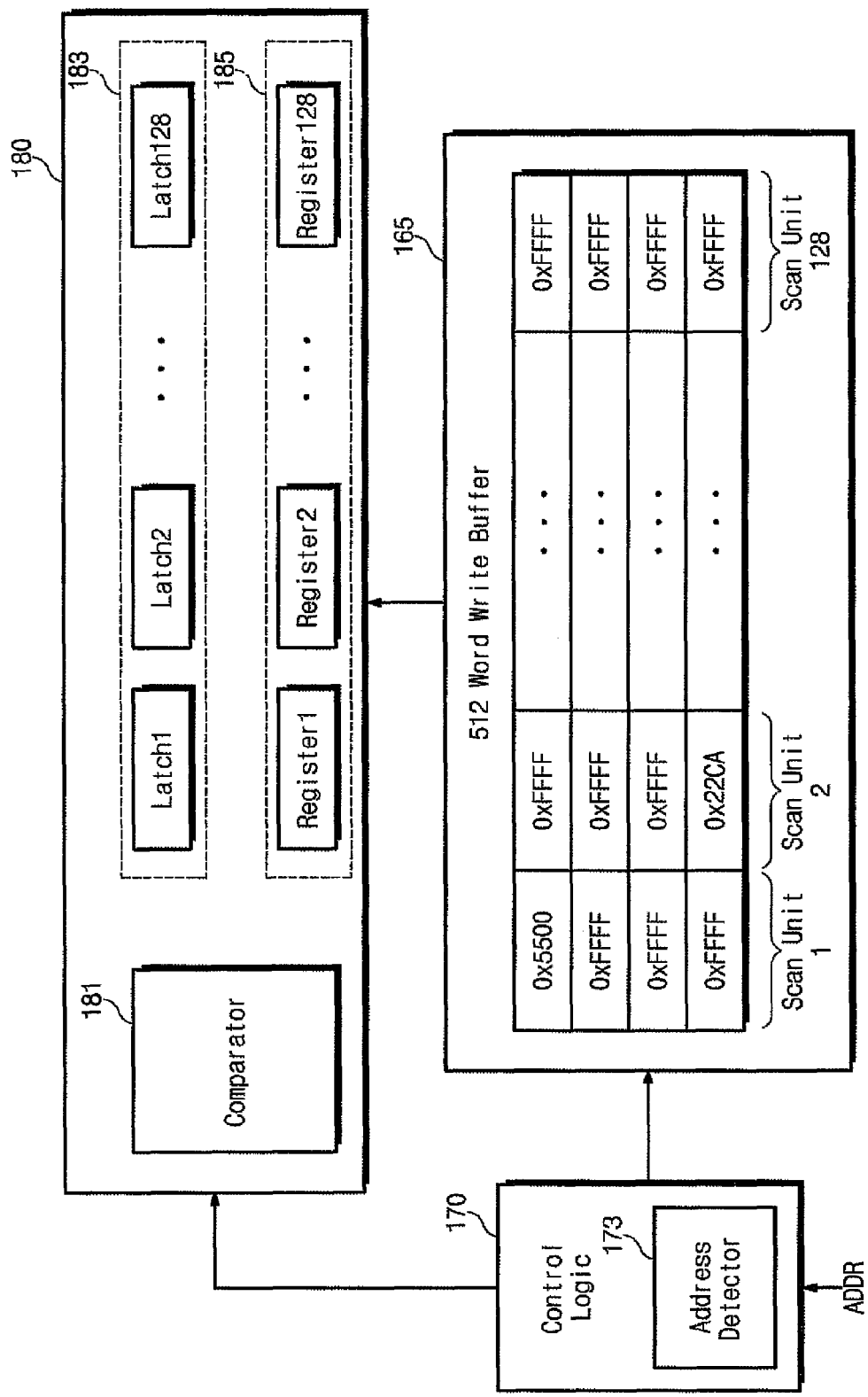
FIG. 6 is a block diagram illustrating operation of a data scanner, according a second embodiment of the inventive concept.

FIG. 6 is a block diagram illustrating an operation of a data scanner, according a second embodiment of the inventive concept.

Referring to FIG. 6, the control logic 170 includes an address detector 173. Additionally, the data scanner 180 includes a comparator 181, multiple latches 183 (i.e., Latch1, Latch2 ... Latch128) and multiple registers 185 (i.e., Register1, Register2 ... Register128).

The control logic 170 senses an address with the data to be programmed, provided from an external device. The control logic 170 determines the address scan unit of the write buffer 165 (i.e., 512 Word Write Buffer) to which the input address belongs. The control logic 170 also sets a register corresponding to the scan unit based on the determined address. The address detector 173 of the control logic 170 senses the address.

The address detector 173 decodes the input address and detects the scan unit of the write buffer 165 in which the data to be programmed are temporarily stored. For purposes of illustration, this will be described with reference to the write buffer 165 including data to be programmed. For example, the address detector 173 senses an input address corresponding to a first offset address of the write buffer 165. Data stored temporarily in the first offset address of the write buffer 165 is data "0x5500" of a first scan unit, scan unit 1. Additionally, the address detector 173 senses an input address corresponding to an eighth offset address of the write buffer 165. Data stored temporarily in the eighth offset address of the write buffer 165 is data "0x22CA" of a second scan unit, scan unit 2.

The control logic 170 also sets registers 185 of the data scanner 180 according to a detection result of the address detector 173. The registers 185 are configured with respect to each scan unit. Thus, the control logic 170 sets a register (e.g., register1-register128) of the registers 185 allocated to a corresponding scan unit when at least one input address corresponds to the offset address of the corresponding scan unit. The control logic 170 does not set a register corresponding to a scan unit when the offset address of the scan unit is not sensed. For example, since an input address corresponding to the first offset address of the scan unit 1 has been sensed, the corresponding register1 is set (e.g., the register has value "1" or logic high). Additionally, since an input address corresponding to the eighth offset address of the scan unit 2 is sensed, the corresponding register2 is set (e.g., the register has value "1" or logic high). However, the registers other than register1 and register2 are not set (e.g., the remaining registers have a value "0" or logic low).

Data stored temporarily in the write buffer 165 are thus provided to the data scanner 180 by scan units under control of the control logic 170. According to an embodiment of the inventive concept, data provided to the data scanner 180 are selectively scanned according to values of the registers 185. That is, after confirming the value of each register 185, the control logic 170 determines whether to scan corresponding data. For example, when the value of a register is "1", data of a corresponding scan unit are scanned, and when the value of a register is "0", data of the corresponding scan unit are not scanned. Accordingly, a data scan operation for searching actual data to be programmed during a program operation is selectively performed based on register information.

Figure 7:
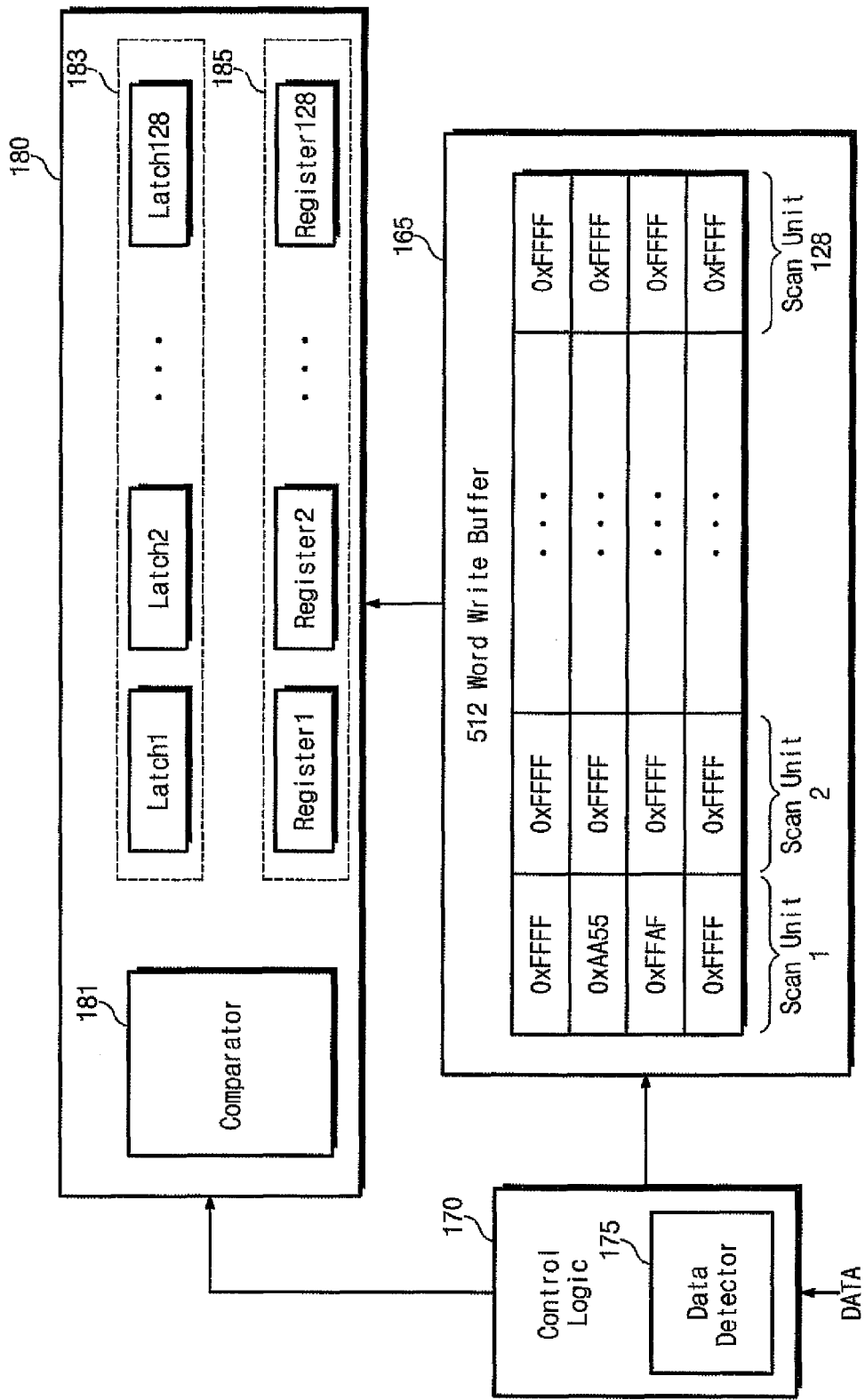
FIG. 7 is a block diagram illustrating operation of a data seanner, according to third embodiment of the inventive concept.

FIG. 7 is a block diagram illustrating an operation of a data scanner, according to third embodiment of the inventive concept.

Referring to FIG. 7, the control logic 170 includes a data detector 175. Additionally, the data scanner 180 includes a comparator 181, multiple latches 183 (i.e., Latch1, Latch2 . . . Latch128) and multiple registers 185 (i.e., Register1, Register2 . . . Register128).

The control logic 170 detects data stored temporarily in the write buffer 165 (i.e., 512 Word Write Buffer). The data stored temporarily in the write buffer 165 are detected by scan unit. When there are data to be programmed in memory cells based on the detection result, registers in the data scanner 180 are set. For data detection, the control logic 170 includes a data detector 175.

The data detector 175 detects whether there are any actual data to be programmed among the data stored temporarily in the write buffer 165. For example, when a memory cell is an SLC or an MLC, the data detector 175 detects a data "0". As another example, in case of a state based memory device programmable based on an input program state, the data detector 175 detects a program state (e.g., program states "10", "01" and "00"). For purposes of illustration, data to be programmed will be described with reference to the write buffer 165. Data "0xAA55" and data "0xFFAF" among data of scan unit 1 are sensed as data to be programmed. However, data of scan unit 2 through scan unit 128 are not sensed as data to be programmed because all data are "0xFFFF".

The control logic 170 sets registers 185 of the data scanner 180 according to detection results of the data detector 175. The registers 185 are configured with respect to corresponding scan units. The control logic 170 sets a register of the registers 185 when there is at least one data to be programmed among data of the corresponding scan unit. The control logic 170 does not set a register when there is no data to be programmed among the data of the corresponding scan unit. For example, since there are data to be programmed among data of the scan unit 1, corresponding register1 is set (e.g., the register has value "1" or logic high). Since data of scan unit 2 through scan unit 128 do not include data to be programmed, the corresponding register2 through register128 are not set (e.g., the registers have value "0" or logic low).

Data stored temporarily in the write buffer 165 are provided to the data scanner 180 by scan unit under control of the control logic 170. According to an embodiment of the inventive concept, data provided to the data scanner 180 are selectively scanned according to the values of the registers 185. That is, the control logic 170 determines whether to scan corresponding data after confirming the value of each of the registers 185. That is, when the value a register is "1", data of the corresponding scan unit are scanned, and when the value of a register is "0", data of the corresponding scan unit are not scanned. Accordingly, a data scan operation searching actual data to be programmed during a program operation is selectively performed according to register information.

A storage unit for storing information on scan operations according to embodiments of the inventive concept consists of a register. However, as would be apparent to one of ordinary skill in the art, the storage unit is not limited to a register. For example, the storage unit may include temporary storage units, such as a latch and a flag cell.

Figure 8:
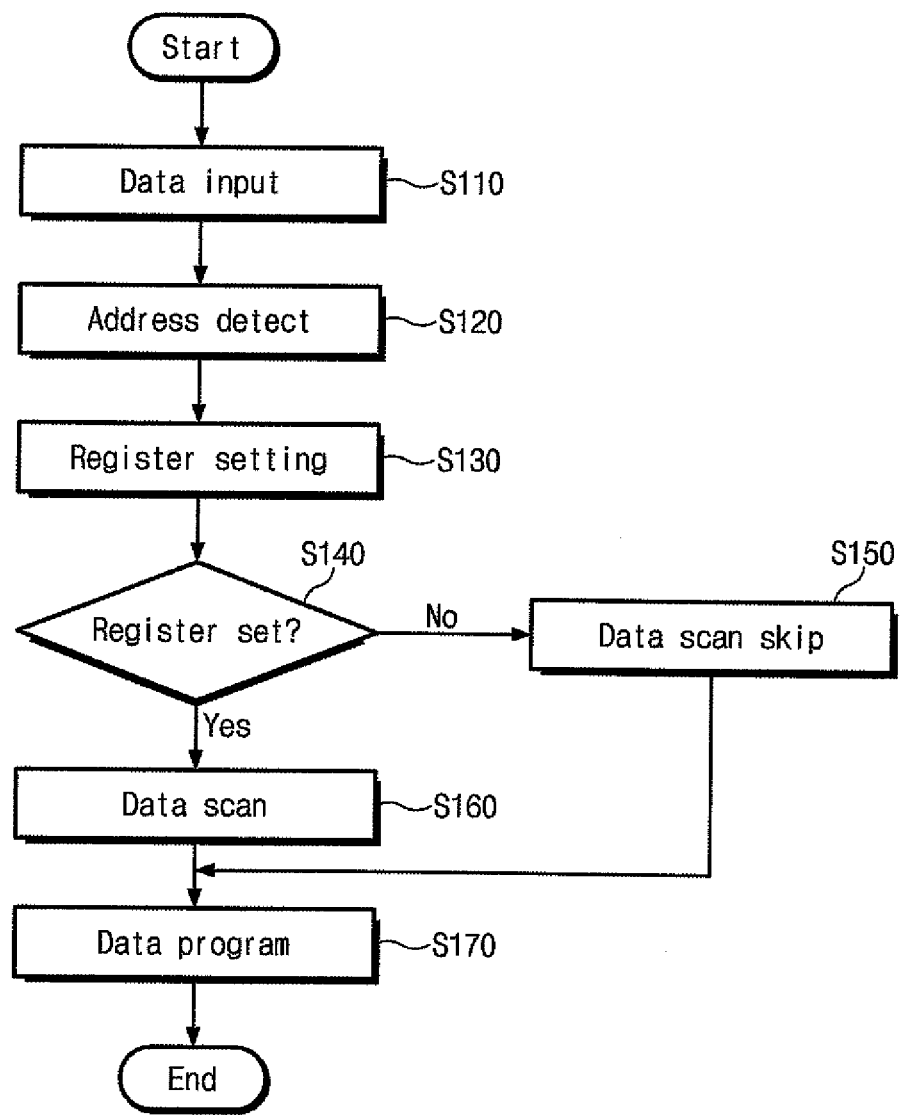
FIG. 8 is a flowchart illustrating an operation of a data scanner according to an embodiment of the inventive concept.

FIG. 8 is a flowchart illustrating an operation of a data scanner, according to an embodiment of the inventive concept.

Referring to FIGS. 1 and 8, data input from an external device (e.g., a host, a memory controller, a memory interface, or the like) is stored temporarily in the data input/output buffer 160 of the flash memory device 100 in operation S110. In operation S120, the control logic 170 detects an address provided when the data is input. For example, the control logic 170 receives an address provided with the data and determines in which scan unit of the write buffer 165 the input address is included.

In operation S130, the control logic 170 sets a value of a register allocated to each scan unit according to a detection result. For example, when at least one input address corresponding to an offset address of a scan unit is detected, the control logic 170 sets a register corresponding to the scan unit (e.g., the register has a value "1"). Data stored temporarily in the data input/output buffer 160 are provided to the data scanner 180 under control of the control logic 170. The temporarily stored data are provided by scan unit.

The data provided to the data scanner 180 are selectively scanned, e.g., according to values of the scan registers 185 of FIG. 6 in operation S140. When the value of a register is not set (e.g., the value of the register is "0"), the data of the corresponding scan unit are not scanned in operation S150. That is, the data scan operation is skipped with respect to the corresponding scan unit. When the value of the register is set (e.g., the value of the register is "1"), the data of the corresponding scan unit are scanned in operation S160. After the data scan operation is selectively performed, the input data are programmed into memory cells in operation S170.

According to an embodiment of the inventive concept, a data scan operation for searching actual data to be programmed may be selectively performed during a program operation. In order to selectively perform a scan operation, a register stores information on whether to scan a corresponding scan unit. When data to be programmed and an address are input, a value of a register for determining whether to scan by detecting input data is set. Whether to scan is determined according to the set value of the register. Accordingly, program speed in increased since unnecessary scan operations are not performed.

Figure 9:
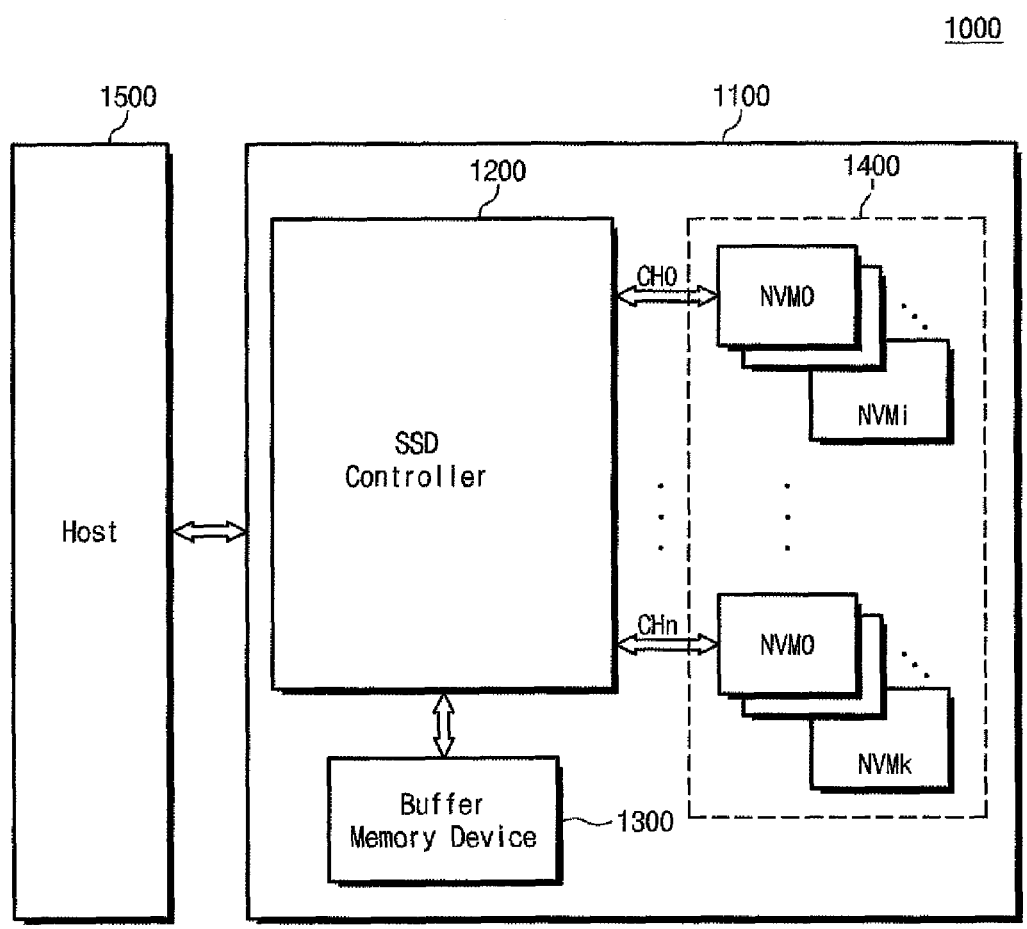
FIG. 9 is a block diagram illustrating a user device with a nonvolatile memory device, according to an embodiment of the inventive concept.

FIG. 9 is a block diagram illustrating a user device with a nonvolatile memory device, according to an embodiment of the inventive concept.

Referring to FIG. 9, a data storage device 1000 includes a solid state drive (SSD) 1100 and host 1500. The SSD 1100 includes an SSD controller 1200, a buffer memory device 1300, and a storage medium 1400. According to an embodiment of the inventive concept, the SSD 1100 may further include a temporary power circuit with super capacitors (not shown). The temporary power circuit may supply power normally to the SSD 1100 upon loss of power.

The SSD 1100 operates in response to an access request of the host 1500. That is, the SSD controller 1200 is configured to access the storage medium 1400 in response to the request from the host 1500. For example, the SSD controller 1200 controls read, write and erase operations of the storage medium 1400. The buffer memory device 1300 temporarily stores data to be stored in the storage medium 1400. Additionally, data read from the storage medium 1400 are temporarily stored in the buffer memory device 1300. The data stored in the buffer memory device 1300 are transmitted to the storage medium 1400 or the host 1500 under control of the SSD controller 1200.

The SSD controller 1200 is connected to the storage medium 1400 through channels CH0 to CHn. Multiple nonvolatile memory devices NVM0 to NVMi are connected to each of the channels CH0 to CHn. That is, the nonvolatile memory devices NVM0 to NVMi share a channel, and the nonvolatile memory devices NVM0 to NVMk share a channel. The storage medium 1400 according to an embodiment of the inventive concept consists of a NAND flash memory device. However, the storage medium 1400 not limited to a NAND flash memory device, as would be apparent to one of ordinary skill in the art. For example, the storage medium 1400 may be a variety of nonvolatile memory devices, such as a NOR flash memory device, a phase-change RAM (PRAM), a ferroelectric RAM (FRAM), a magnetic RAM (MRAM), or the like.

Figure 10:
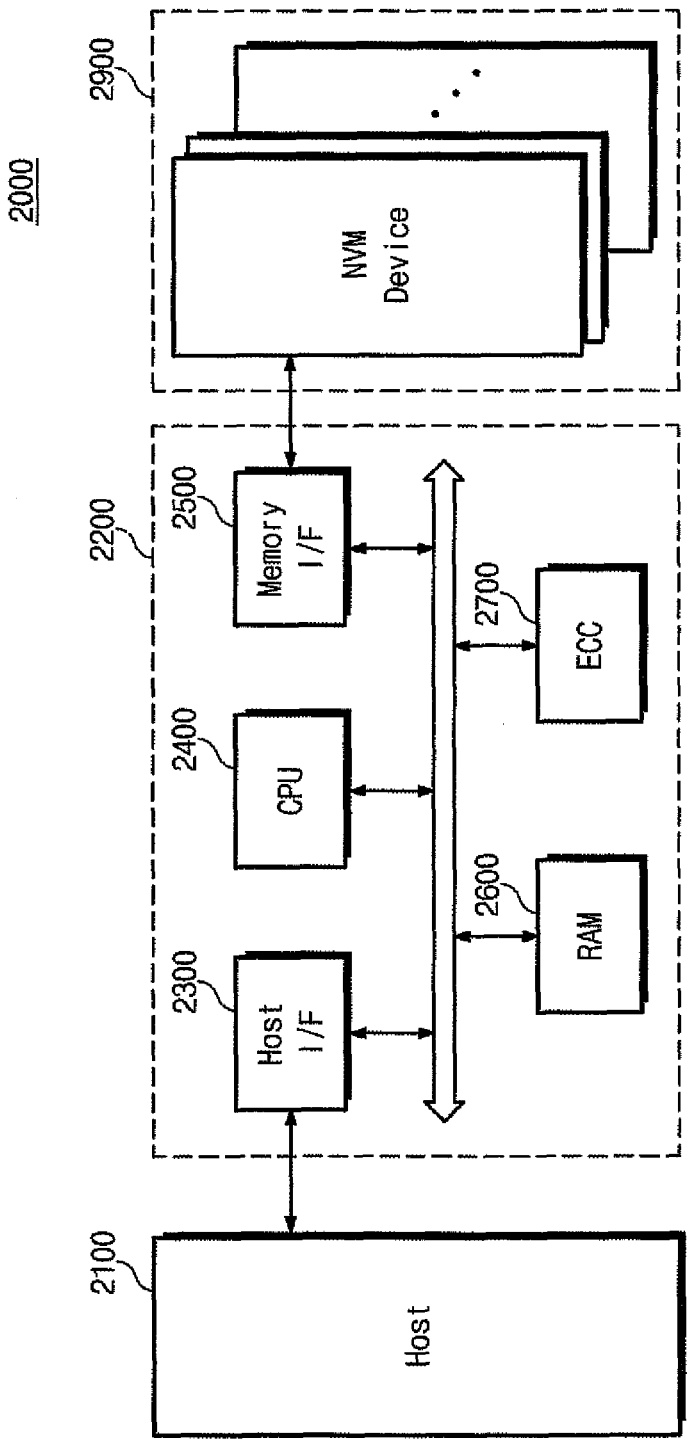
FIG. 10 is a block diagram illustrating another user device with a nonvolatile memory device, according to an embodiment of the inventive concept.

FIG. 10 is a block diagram illustrating another user device with a nonvolatile memory device, according to an embodiment of the inventive concept.

Referring to FIG. 10, the memory system 2000 includes a memory controller 2200 and multiple nonvolatile memory devices 2900. The memory controller 2200 is connected to a host 2100 and the nonvolatile memory devices 2900. The memory controller 2200 is configured to access the nonvolatile memory devices 2900 in response to a request from the host 2100. For example, the memory controller 2200 is configured to control read, write and erase operations of the nonvolatile memory devices 2900. The memory controller 2200 is configured to provide an interface between the nonvolatile memory devices 2900 and the host 2100. The memory controller 2200 may drive firmware in order to control the nonvolatile memory devices 2900.

The memory controller 2200 includes a host interface 2300, a central processing unit (CPU) 2400, a memory interface 2500, RAM 2600 and an error correcting code (ECC) 2700. The CPU 2400 control general operations of the memory controller 2200. The RAM 2600 may serve as a working memory of the CPU 2400.

The host interface 2300 includes a protocol performing data exchange between the host 2100 and the memory controller 2200. For example, the host interface 2300 is configured to communicate with the outside (host 2100) through at least one of various interface protocols, such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, and an integrated drive electronics (IDE) protocol.

The ECC 2700 detects and corrects errors of data read from the nonvolatile memory devices 2900. The ECC 2700 may be provided as a component of the memory controller 2200, as shown. Alternatively, the ECC 2700 may be a component of the nonvolatile memory devices 2900. The memory interface 2500 provides an interface between the nonvolatile memory devices 2900 and the memory controller 2200.

As would be apparent to one of ordinary skill in the art that components of the memory controller 2200 are not limited to the configuration describe above. For example, the memory controller 2200 may further include code for initial booting and read only memory (ROM) for storing data to interface with the host 2100.

The controller 2200 and the nonvolatile memory devices 2900 may be integrated into a single semiconductor device and form a memory card, such as a PC card Personal Computer Memory Card International Association (PCMCIA) card, a compact flash (CF) card, a smart media card (SM, SMC), a memory stick, a multimedia card (MMC, RS-MMC, MMCmicro), an SD card (SD, miniSD, microSD, SDHC), a universal flash storage (UPS), or the like.

As another example, the memory controller 2200 and the nonvolatile memory devices 2900 may be applied to various components of an electronic device, such as a computer, a ultra mobile personal computer (UMPC), a workstation, a net-book, a personal digital assistance (PDA), a personal computer (PC), a web tablet, a wireless phone, a mobile phone, a smart phone, an e-book, a portable multimedia player (PMP), a portable game console, a navigation system, a black box, a digital camera, a digital multimedia broadcasting (DMB) player, a digital audio recorder, a digital audio player, a digital picture recorder, a digital picture player, a digital video recorder, a digital video player, a wireless communication device, one of various electronic devices constituting a home network, one of various electronic devices constituting a computer network, one of various electronic devices constituting a telematics network, a radio frequency identification (RFID) device, or the like.

As another example, the memory controller 2200 and the nonvolatile memory devices 2900 may be mounted using various kinds of packages. For instance, the memory controller 2200 and/or the nonvolatile memory devices 2900 may be mounted in packages, such as a Package on Package (PoP), Ball Grid Array (BGA), Chip Scale Package (CSP), Plastic Leaded Chip Carrier (PLCC), Plastic Dual In-line Package (PDIP), Die-in-Waffle Pack, Die-in-Wafer Form, Chip On Board (COB), Ceramic Dual In-line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi Chip Package (MCP), Wafer-level Fabricated Package (WFP), and Wafer-level Processed Stack Package (WSP).

Figure 11:
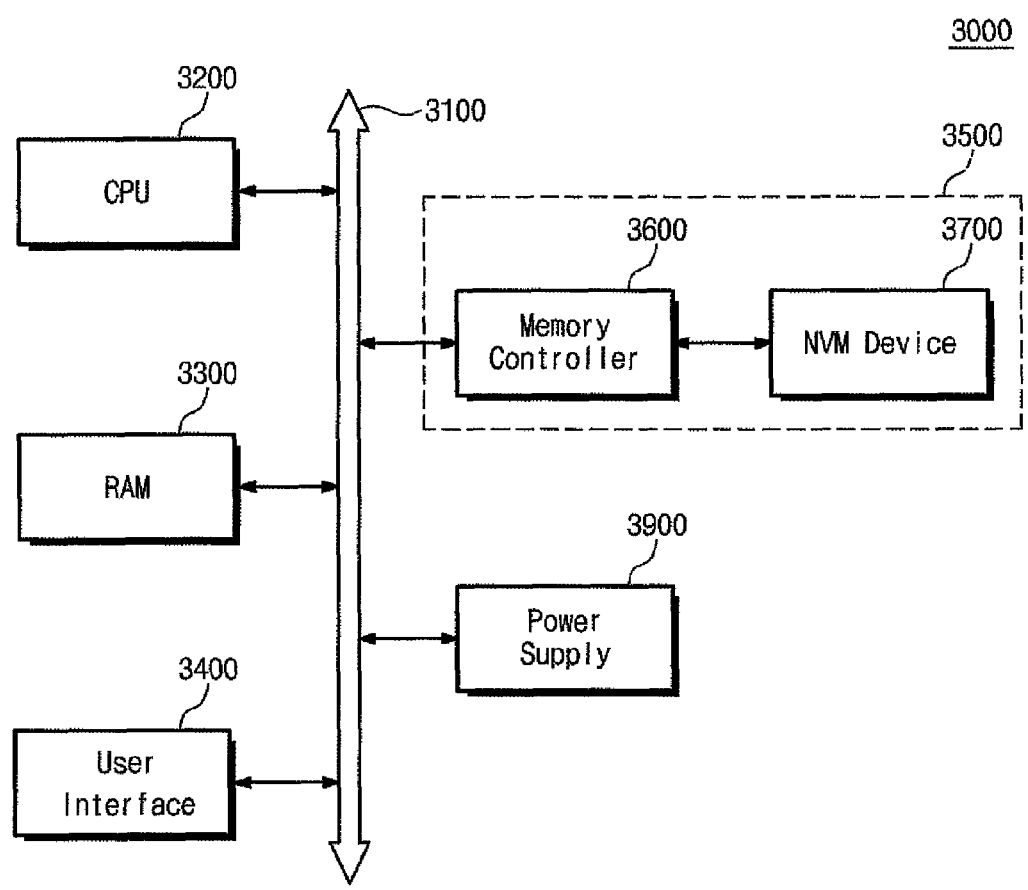
FIG. 11 is a block diagram illustrating another user device with a nonvolatile memory device, according to an embodiment of the inventive concept.

FIG. 11 is a block diagram illustrating another user device with a nonvolatile memory device according to an embodiment of the inventive concept.

Referring to FIG. 11, user device 3000 includes a system bus 3100, a CPU 3200, RAM 3300, a user interface 3400, a data storage unit 3500, and a power supply 3900.

The data storage device 3500 includes a memory controller 3600 and a nonvolatile memory device 3700, which may include one or more nonvolatile memory devices. Data provided through the user interface 3400 or processed by the CPU 3200 are stored in the nonvolatile memory device 3700 through the memory controller 3600 and the system bus 3100. The data stored in the nonvolatile memory device 3700 are provided to the CPU 3200 and/or the user interface 3400 through the memory controller 3600 and the system bus 3100.

The RAM 3300 is used as a working memory of the CPU 3200. The power supply 3900 supplies an operating power to the user device 3000. For example, in order to enable portability of the user device 3000, the power supply 3900 may be a portable power supply device, such as a battery. Although not illustrated in the drawings, the user device 3000 according to the inventive concept may further include an application chipset and a camera image processor, for example.

Nonvolatile memory devices according to embodiments of the inventive concept select data to be programmed during a program operation, such that programming time is reduced.

While the inventive concept has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A nonvolatile memory device comprising:
   a memory cell array including a plurality of memory cells;
   a data input/output buffer temporarily storing data to be stored in the plurality of memory cells;
   a data scanner scanning the data stored temporarily in the data input/output buffer; and
   control logic reading address information of a memory cell in which at least a portion of the data is to be stored and selectively performing a data scan operation according to the read address information.

2. The nonvolatile memory device of claim 1, wherein the data scanner comprises a storage unit storing information on whether to perform a data scan operation, the storage unit corresponding to a scan unit of the data scanner.

3. The nonvolatile memory device of claim 2, wherein the control logic comprises an address detector reading the address information, wherein the address detector determines whether address information corresponding to an offset address of the scan unit is received, and the control logic stores data in the corresponding storage unit according to a determination result of the address detector.

4. The nonvolatile memory device of claim 3, wherein the data scan operation is selectively performed according to the data stored in the storage unit.

5. The nonvolatile memory device of claim 2, wherein the storage unit is set by grouping the data stored temporarily in the data input/output buffer and the data scan operation is performed by the scan unit.

6. The nonvolatile memory device of claim 2, wherein the storage unit is a register.

7. The nonvolatile memory device of claim 1, wherein the data scanner distinguishes a program state according to a data value stored temporarily in the data input/output buffer and aligns data to be programmed simultaneously based on the distinguished program state.

8. The nonvolatile memory device of claim 1, wherein the data scanner searches actual data bits to be programmed among the data stored temporarily in the data input/output buffer.

9. The nonvolatile memory device of claim 1, wherein the data scanner comprises a latch circuit storing a scanned result.

10. The nonvolatile memory device of claim 9, further comprising:
a write driver programming the data stored in the latch circuit simultaneously by the number of bits that are simultaneously programmable in a corresponding memory cell.

11. The nonvolatile memory device of claim 1, wherein the data input/output buffer inputs or outputs data by an N byte unit (N is a natural number).

12. The nonvolatile memory device of claim 1, wherein the memory cell array comprises a plurality of bit lines, each of the bit lines connecting a plurality of memory cells arranged in parallel.

13. The nonvolatile memory device of claim 1, wherein a memory element of the memory cell comprises a variable resistance material.

14. A nonvolatile memory device comprising:
a memory cell array including a plurality of memory cells;
a data input/output buffer temporarily storing data to be stored in the plurality of memory cells;
a data scanner aligning the data stored temporarily in the data input/output buffer by data to be programmed simultaneously according to a data value; and
control logic controlling a scan operation of the data scanner,
wherein the data scanner comprises a storage unit storing information on whether to perform a data scan operation of a corresponding scan unit; and
wherein the control logic stores information on whether to perform a data scan operation in the storage unit according to address information of a memory cell in which the data is to be stored, and selectively performs the scan operation according to a stored value of the storage unit.

15. The nonvolatile memory device of claim 14, wherein the data scanner searches actual data bits to be programmed among the data stored temporarily in the data input/output buffer.

16. A method of programming a nonvolatile memory device, the method comprising:
receiving data and an address from an external device;
temporarily storing the received data in a data input/output buffer;
reading the address;
storing information on whether to scan the temporarily stored data according to the input address; and
selectively performing a data scan operation according to the stored information on whether to scan the temporarily-stored data.

17. The method of claim 16, wherein reading the address comprises reading by scan unit which is set by grouping the temporarily stored data.

18. The method of claim 17, wherein storing the information on whether to scan the temporarily stored data comprises storing a logic high value in a storage unit corresponding to the scan unit when an address corresponding to an offset address of the scan unit is read.

19. The method of claim 18, wherein when at least one address corresponding to an offset address of the scan unit is read, the storage unit stores a logic high value.

20. The method of claim 16, wherein storing the information on whether to scan the temporarily stored data and selectively performing the data scan operation are completed before a program operation is performed.

* * * * *